(12) United States Patent
Yang

(10) Patent No.: US 6,790,746 B1
(45) Date of Patent: Sep. 14, 2004

(54) METHOD FOR IMPROVEMENT OF EDGE BREAKDOWN CAUSED BY EDGE ELECTRICAL FIELD AT A TUNNEL OXIDE OF A HIGH-DENSITY FLASH MEMORY BY A SHIELDED BIRD'S BEAK

(75) Inventor: Yun-Chi Yang, Cyonglin (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/630,868

(22) Filed: Jul. 31, 2003

(30) Foreign Application Priority Data

Apr. 10, 2003 (TW) ........................................ 92108326 A

(51) Int. Cl.⁷ .............................................. H01L 21/76
(52) U.S. Cl. ........................ 438/424; 438/221; 438/296
(58) Field of Search ................................ 438/424, 242, 438/296, 439, 221, 692, 700, 770, 773

(56) References Cited

U.S. PATENT DOCUMENTS

| 5,680,345 | A | * | 10/1997 | Hsu et al. .............. 365/185.01 |
| 6,046,987 | A | * | 4/2000 | Tagawa ...................... 370/252 |
| 6,495,424 | B2 | * | 12/2002 | Kunikiyo .................... 438/296 |
| 6,544,839 | B1 | * | 4/2003 | Kanamitsu et al. ......... 438/253 |
| 6,555,427 | B1 | * | 4/2003 | Shimizu et al. ............. 438/238 |

* cited by examiner

*Primary Examiner*—David Nhu
(74) *Attorney, Agent, or Firm*—Rabin & Berdo, P.C.

(57) ABSTRACT

To improve the edge breakdown caused by edge electrical field at the tunnel oxide of high-density flash memory, a bird's beak is formed at the edge of the active region of the flash memory to prevent the corner of the tunnel oxide layer formed later on the active region from being excessively sharp, which will result in localized intense electrical field, and further lead to breakdown caused by the edge electrical field.

15 Claims, 5 Drawing Sheets

US 6,790,746 B1

METHOD FOR IMPROVEMENT OF EDGE BREAKDOWN CAUSED BY EDGE ELECTRICAL FIELD AT A TUNNEL OXIDE OF A HIGH-DENSITY FLASH MEMORY BY A SHIELDED BIRD'S BEAK

FIELD OF THE INVENTION

The present invention relates generally to a high-density flash memory, and more particularly to a method to improve the edge breakdown caused by edge electrical field at the tunnel oxide of a high-density flash memory by a shielded bird's beak.

BACKGROUND OF THE INVENTION

The development trend of the fabrication technology for integrated circuit (IC) substantially concentrates on the shrinkage of the transistors thereof, by which the switching speed and power consumption could be improved, as well as the integration density and functionality are also enhanced. In a conventional localized oxidation of silicon (LOCOS) method, the capability of miniaturization thereof is limited to the extent of a few microns by the bird's beak effect and the uneven surface. Therefore, for the purpose of overcoming this problem, shallow trench isolation (STI) technology has been developed for breaking through the bottleneck being confronted.

Typically, the STI process comprises forming a mask on a silicon substrate, defining a STI pattern by lithography process and then etching trenches using the mask, afterward, filling the trenches with an oxide and optionally forming a linear oxide on the trenches prior to the filling the oxide. It is generally followed by a further chemical-mechanical polishing (CMP) for etching-back the oxide and planarizing the surface thereof. Then, the transistor structure could be fabricated on the active region between the STIs.

Although the element with reduced size may be obtained by STI technology, the excessively sharp shape of the corners of the tunnel oxide layer formed later on the active regions may lead to a localized intense electrical field, and thereby resulting in breakdown caused by edge electrical field formed thereof.

Therefore, it is desired a method for improvement of the edge breakdown caused by edge electrical field at the tunnel oxide of a high-density flash memory.

SUMMARY OF THE INVENTION

It is accordingly an object of the present invention to propose a method to avoid or reduce the edge breakdown caused by edge electrical field at the tunnel oxide of a high-density flash memory by a shielded bird's beak.

To improve the edge breakdown caused by edge electrical field at a tunnel oxide of a high-density flash memory, according to the present invention, the method comprises depositing a pad layer on a substrate and then defining a plurality of shallow trench isolations and a plurality of active regions, etching the substrate with the pad layer as a mask to form a plurality of trenches, growing a liner oxide on the trenches to extend to the edges of the active regions for the fabrication of initial bird's beaks, afterward, depositing an oxide to fill in the trenches, etching-back the oxide by chemical-mechanical polishing with the pad layer as an etch-stop layer to leave a planarized surface, depositing an oxide again to cover the STI oxide after the pad layer is removed, and etching the oxide for formation of bird's beak spacers to shield the initial bird's beaks, which will prevent the corners of the tunnel oxide layer formed later on the active regions from being excessively sharp.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which:

FIG. 1 is the cross-sectional view after a pad nitride is formed on a substrate and a pattern of shallow trench isolations is defined;

FIG. 2 is the cross-sectional view after etching the trenches for shallow trench isolations;

FIG. 3 is the cross-sectional view after the formation of a liner oxide on the trenches;

FIG. 4 is the cross-sectional view after depositing an oxide by high-density plasma deposition and after chemical mechanical polishing;

FIG. 5 is the cross-sectional view after the pad nitride is removed;

FIG. 6 is the cross-sectional view after a high-temperature oxide deposition is performed;

FIG. 7 is the cross-sectional view after forming bird's beak spacers by etching process;

FIG. 8 is the cross-sectional view after depositing a sacrificial oxide;

FIG. 9 is the cross-sectional view after the sacrificial oxide is removed; and

FIG. 10 is the cross-sectional view after forming a tunnel oxide layer.

DETAILED DESCRIPTION OF THE INVENTION

Figure 1:
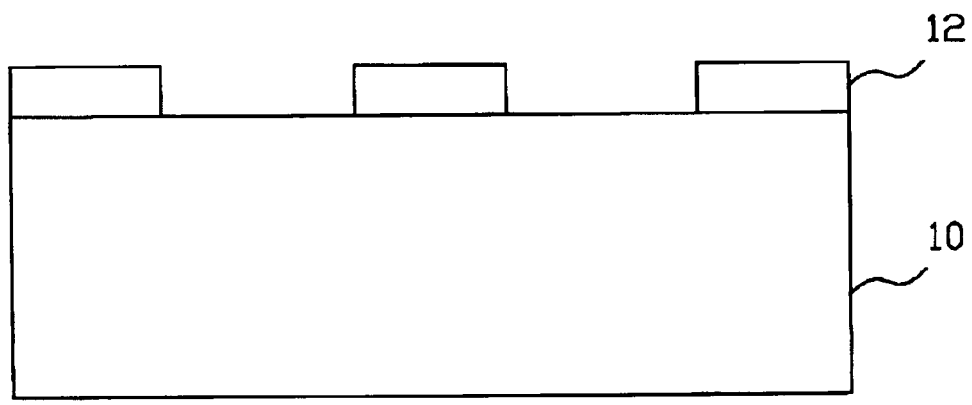
FIGS. 1–10 are provided to show an embodiment according to the present invention.
Figure 2:
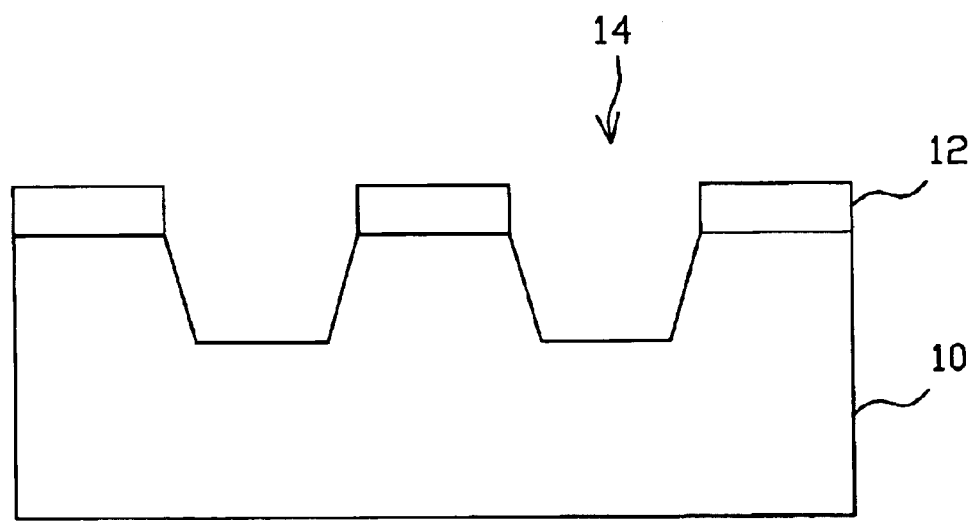
Figure 3:
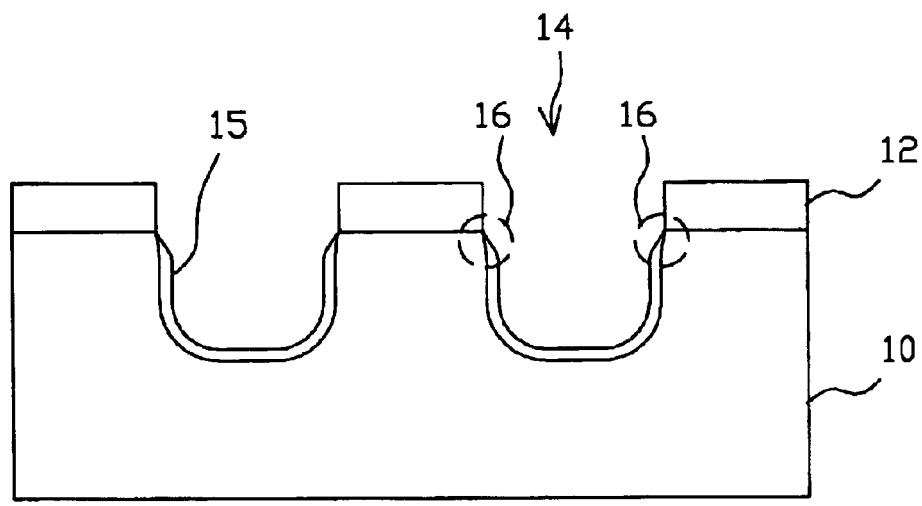
Figure 4:
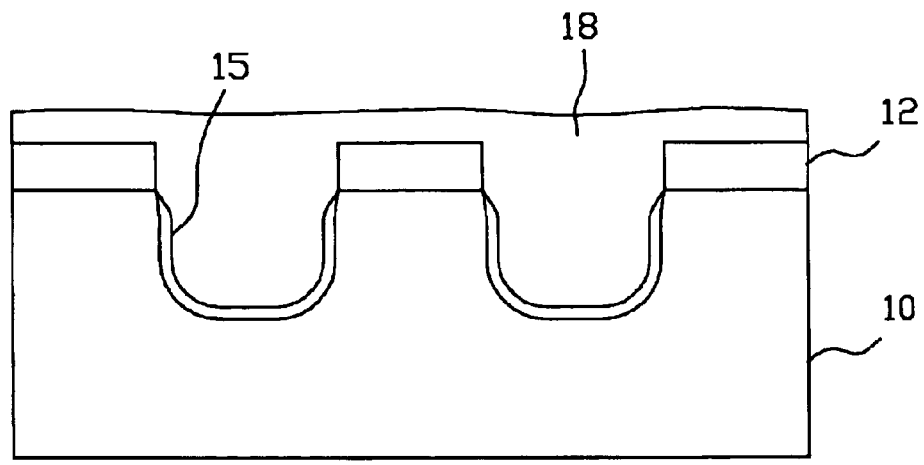
Figure 5:
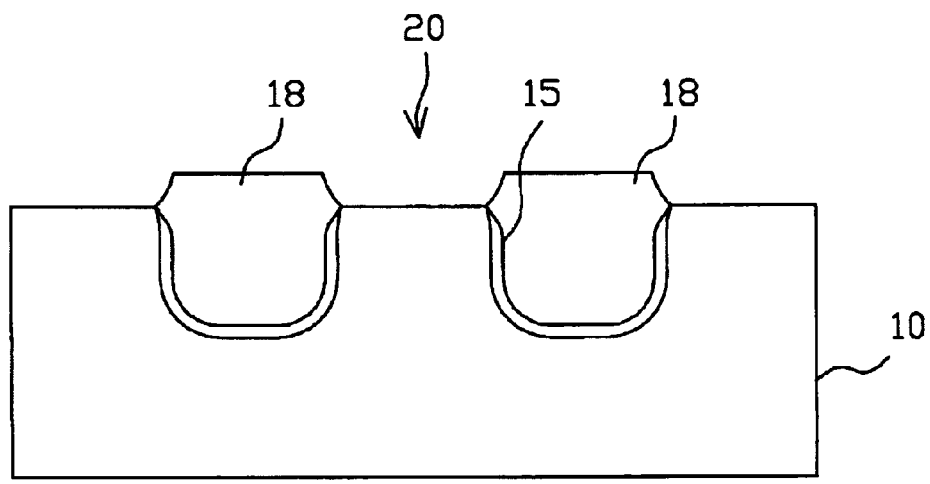
Figure 6:
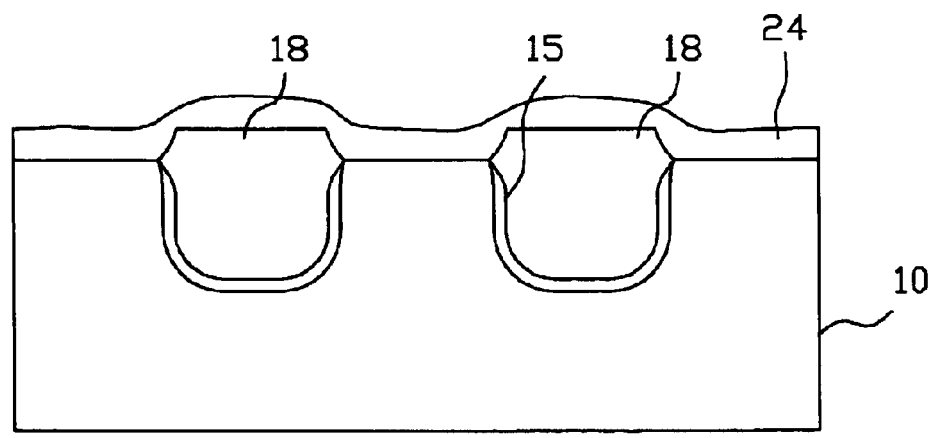
Figure 7:
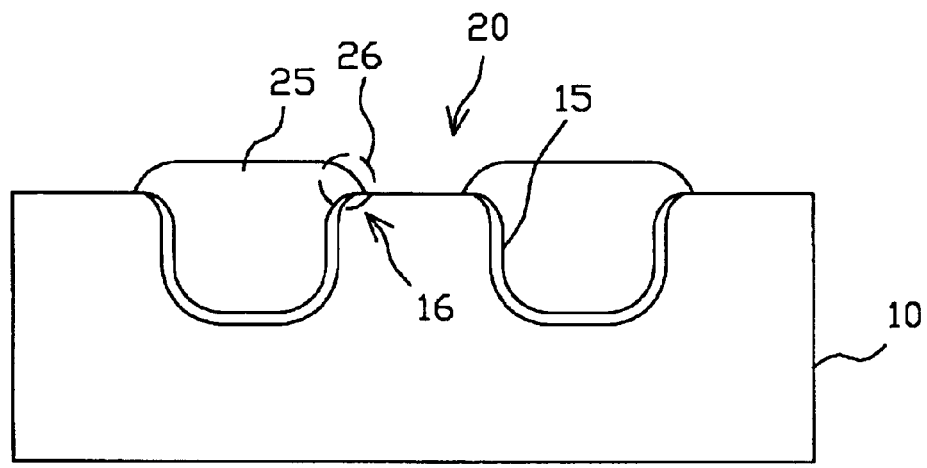
Figure 8:
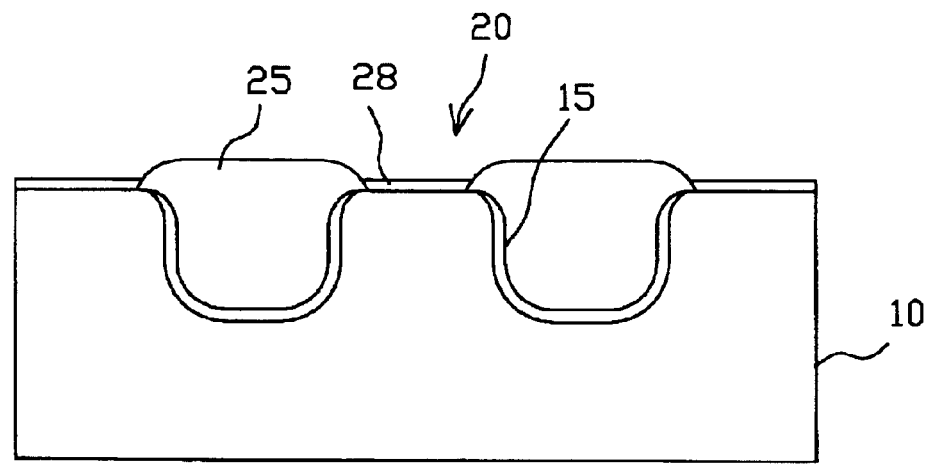
Figure 9:
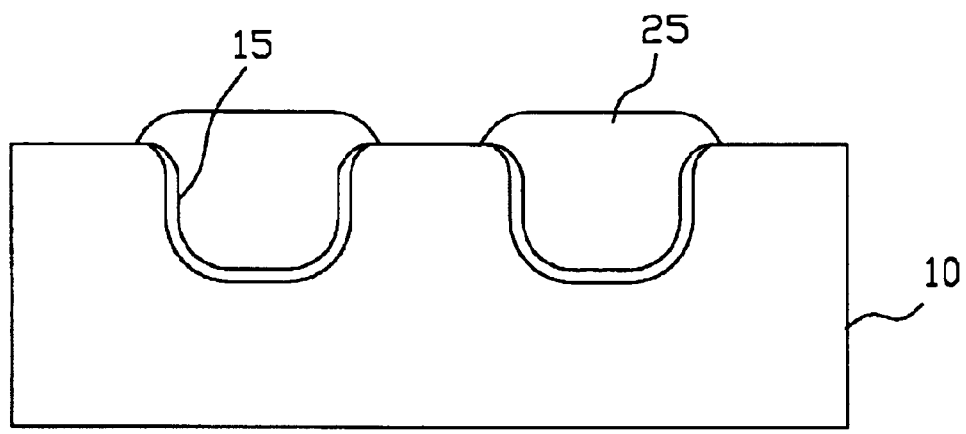
Figure 10:
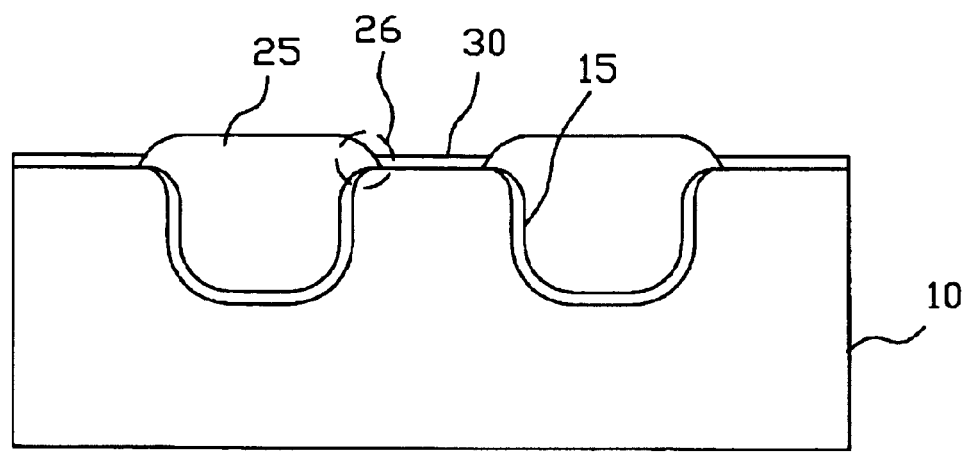

FIGS. 1–10 are used hereinafter to illustrate an embodiment according to the present invention. As shown in FIG. 1, a silicon nitride is deposited on a silicon substrate 10 at first. Then, a pattern of shallow trench isolations is defined and the silicon nitride is etched to form a plurality of pad nitrides 12. Afterward, the substrate 10 is etched with the pad nitrides 12 as a mask to form a plurality of trenches 14, as shown in FIG. 2. Subsequently, as shown in FIG. 3, a high-temperature oxidation growth process is performed at 1100–1200° C. to form a liner oxide 15 on the surfaces of the trenches 14. By this step, the edges of the trenches 14 are smoothed and bird's beaks 16 will be formed simultaneously to intrude beneath the pad nitrides 12 on the active regions. As shown in FIG. 4, each of the trenches 14 is then filled with an oxide layer 18 for example by high-density plasma deposition at 400–550° C. As shown in FIG. 5, the oxide layer 18 is further polished-back for example by chemical-mechanical polishing with the pad nitrides 12 as an polish-stop layer, and a planarized surface is obtained. The pad nitrides 12 are then removed to expose the active regions 20, as shown in FIG. 5. As shown in FIG. 6, an oxide 24 is further deposited by high-temperature oxide deposition at 800–900° C. to cover the STIs 18 and active regions 20. Moreover, the deposited oxides 18 and 24 are fused with each other to form an oxide 25 in this high-temperature process. The oxide 25 is then etched to expose the active regions 20 again, and at that time, bird's beak spacers 26 are formed from a part of the oxide 25 at the edges of the active regions 20, as shown in FIG. 7. This bird's beak spacers 26 will be self-aligned to and shield the bird's beaks 16. The step of etching the oxide 25 may be applied as over-etching to remove a thickness of the silicon substrate 10 from its top surface on the active regions 20. Alternatively, a sacrificial oxide 28 may be formed by oxidation on the active regions 20 and then removed to clean the top surface of the substrate 10, as shown in FIGS. 8 and 9, in which the preparation and removal of the sacrificial oxide 28 are provided to eliminate the particles or materials remained on the active regions 20 resulted from the previous processes. Finally, a tunnel oxide 30 is formed on the active regions 20, as shown in FIG. 10, and the corners of the edges of the active regions 20 are covered by the bird's beaks 26 at two sides of the active regions 20 to prevent the formation of the tunnel oxide 30 from forming a tip, which may occur owing to the curved shape thereof.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for improvement of edge breakdown caused by edge electrical field at a tunnel oxide of a high-density flash memory by a shielded bird's beak, the method comprising the steps of:

forming a plurality of trenches on a substrate for isolating a plurality of active regions;

forming a liner oxide on the plurality of trenches and extending to respective edges of the plurality of active regions;

depositing a first oxide filled in the plurality of trenches for forming a plurality of shallow trench isolations;

depositing a second oxide for covering the plurality of shallow trench isolations and active regions;

etching the second oxide for forming a plurality of bird's beak spacers at the respective edges of the plurality of active regions; and forming a tunnel oxide layer on the plurality of active regions.

2. The method according to claim 1, wherein the step of forming a plurality of trenches comprises the steps of:

forming a pad nitride on the substrate;

defining a pattern for the plurality of shallow trench isolations on the pad nitride; and etching the substrate with the pad nitride as a mask for forming the plurality of trenches.

3. The method according to claim 1, wherein the step of forming a plurality of shallow trench isolations comprises the steps of:

depositing the first oxide by a high-density plasma deposition; and chemical-mechanical polishing the first oxide.

4. The method according to claim 1, wherein the step of forming a second oxide comprises a high-temperature oxide deposition.

5. The method according to claim 1, further comprising the steps of:

forming a sacrificial oxide on the plurality of the active regions after the formation of a plurality of bird's beak spacers; and removing the sacrificial oxide.

6. The method according to claim 1, wherein the liner oxide forms a plurality of initial bird's beaks at the respective edges of the plurality of active regions.

7. The method according to claim 6, wherein the bird's beak spacers are self-aligned to and shield the plurality of initial bird's beaks.

8. A method for improvement of edge breakdown caused by edge electrical field at a tunnel oxide of a high-density flash memory by a shielded bird's beak, the method comprising the steps of:

depositing a pad nitride on a substrate;

defining a pattern for an active region and a shallow trench isolation on the pad nitride;

etching the substrate with the pad nitride as a mask for forming a trench;

forming a liner oxide on the trench and extending to an edge of the active region for intruding under the pad nitride to form a bird's beak;

depositing a first oxide filled in the trench and covering on the pad nitride;

polishing-back the first oxide;

removing the pad nitride;

depositing a second oxide for covering the first oxide and active region;

etching the second oxide for forming a bird's beak spacer at an edge of the active region; and forming a tunnel oxide layer on the active region.

9. The method according to claim 8, wherein the step of forming a liner oxide comprises a high-temperature oxidation at a temperature of about 1100–1200° C.

10. The method according to claim 8, wherein the step of depositing a first oxide comprises a high-density plasma deposition at a temperature of about 400–550° C.

11. The method according to claim 8, wherein the step of polishing-back the first oxide comprises chemical-mechanical polishing with the pad nitride as a etch-stop layer.

12. The method according to claim 8, wherein the step of depositing a second oxide comprises a high-temperature oxide deposition at a temperature of about 800–900° C.

13. The method according to claim 12, wherein the first and second oxides are fused with each other.

14. The method according to claim 8, wherein the step of etching the second oxide comprises an over-etching of a thickness of the substrate at the active region.

15. The method according to claim 8, further comprising the steps of:

forming a sacrificial oxide on the active region after the formation of the bird's beak spacer; and removing the sacrificial oxide.

* * * * *